United States Patent
Sung et al.

(10) Patent No.: US 6,568,053 B1
(45) Date of Patent: May 27, 2003

(54) METHOD FOR MANUFACTURING A CERAMIC RESONATOR

(75) Inventors: Nak Cheol Sung, Kyungki-do (KR); Min Soo Kim, Kyungki-do (KR); Jeong Ho Cho, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 190 days.

(21) Appl. No.: 09/680,014

(22) Filed: Oct. 5, 2000

Related U.S. Application Data

(62) Division of application No. 09/337,279, filed on Jun. 22, 1999, now Pat. No. 6,259,189.

(30) Foreign Application Priority Data

Dec. 19, 1998 (KR) .............................. 98-56534
May 12, 1999 (KR) .............................. 99-16945

(51) Int. Cl.7 ................................................ H04R 17/00
(52) U.S. Cl. ..................... 29/25.35; 29/827; 29/25.35; 29/25.41; 29/25.42; 29/841; 29/854; 29/855; 29/412; 29/417; 310/348; 310/365; 310/366; 361/321.2; 361/303; 361/306.3
(58) Field of Search ................. 29/827, 25.35, 29/25.41, 25.42, 841, 854, 855, 856, 412, 417; 310/348, 365, 366; 361/321.2, 303, 306.3

(56) References Cited

U.S. PATENT DOCUMENTS

| | | |
|---|---|---|
| 5,166,570 A | 11/1992 | Takahashi |
| 5,317,792 A * | 6/1994 | Tanaka ........................ 29/25.35 |
| 5,345,136 A * | 9/1994 | Takagi et al. ................ 310/320 |
| 5,577,319 A * | 11/1996 | Knecht ......................... 257/687 |
| 5,804,797 A * | 9/1998 | Kaimoto et al. ............. 219/483 |
| 5,825,120 A | 10/1998 | Maesaka et al. |
| 5,935,358 A * | 8/1999 | Yamasaki ................. 156/89.12 |
| 5,942,836 A | 8/1999 | Yoshida et al. |
| 6,087,763 A * | 7/2000 | Kim et al. ................... 310/348 |

FOREIGN PATENT DOCUMENTS

| | | |
|---|---|---|
| DE | 26 24 660 | 12/1977 |
| JP | 1995-102697 | 4/1995 |

* cited by examiner

Primary Examiner—Carl J. Arbes
Assistant Examiner—Tai Nguyen
(74) Attorney, Agent, or Firm—Renner, Otto, Boisselle & Sklar, LLP

(57) ABSTRACT

A method for manufacturing a ceramic resonator is disclosed. The method comprises the steps of forming a ceramic piezoelectric device, a capacitor chip and a lead frame, assembling the piezoelectric device and the capacitor chip into the lead frame, and molding the assembled chip by using epoxy resin. A process for making the capacitor includes the steps of cutting a ceramic wafer into a plurality of sub-wafers, printing electrodes on one face of the sub-wafer in a dual-striped form, drying the sub-wafer thus printed, printing another electrode on a central part of another face of the sub-wafer so as to be overlapped with the electrodes of the one face of the sub-wafer, drying the sub-wafer thus printed, baking the sub-wafer thus dried; and cutting the sub-wafer thus baked into a plurality of capacitors.

19 Claims, 5 Drawing Sheets

(PRIOR ART)

US 6,568,053 B1

METHOD FOR MANUFACTURING A CERAMIC RESONATOR

This application is a divisional of prior U.S. Patent Application Ser. No. 09/337,279 filed Jun. 22,1999 now U.S. Pat. No. 6,259,189.

BACKGROUND OF THE INVENTION

1. Field of the Invention

The present invention relates to a high frequency resonator and a manufacturing method therefor. More specifically, the present invention relates to a ceramic resonator and a manufacturing method therefor, in which a plurality of interconnected electrodes are formed on a face of a sub-wafer by printing a metal paste, and a plurality of the electrodes are also printed on the other face of the sub-wafer so that uniform capacitances can be obtained from the both end portions of the capacitor chip, thereby improving the characteristics of the resonator.

2. Description of the Prior Art

Generally, the ceramic resonators which periodically oscillate by being tuned with a certain frequency are widely used as oscillators in remote controllers, floppy disc drivers (FDD), hard disc drivers (HDD), watches and the like. The high frequency resonators include 2-terminal type and 3-terminal type. In the 2-terminal type, a capacitor is externally attached to the resonator, while in the 3-terminal type, the capacitor is internally installed. FIG. 1 illustrates a 3-terminal type resonator.

As shown in FIG. 1, a resonator 10 includes: a piezoelectric device 13, a capacitor 11, and a lead frame 15 for receiving the piezoelectric device 13 and the capacitor chip 11. FIG. 2 is a detailed illustration of the capacitor chip 11 which is internally installed in the resonator of FIG. 1. This capacitor is manufactured by going through the process as shown in FIGS. 3(a)–3(e).

That is, the manufacturing process for the capacitor chip according to the present invention is carried out as shown in FIG. 3. That is, as shown in FIGS. 3a and 3b, a wafer is cut into a plurality of sub-wafers 1, and then, an electrode layer 2 is formed on one face of the sub-wafer 1. Then an electrode layer 4 is formed on the other face of the sub-wafer 1 in the same manner. Then as shown in FIG. 3c, a resist layer 3 is formed by printing a photo-imageable resist on a part of the electrode layer 2 of the sub-wafer 1. Then the sub-wafer 1 is exposed by using a pattern film, and then, the resist is removed by carrying out an etching on the areas other than the exposed areas, so as to form an electrode 2a as shown in FIG. 3d. Meanwhile, for an impedance matching, another electrode 4a is formed on the other face of the sub-wafer 1. After forming the electrodes, the sub-wafer 1 is cut in the x—y direction as shown in FIG. 3d, and thus, a capacitor chip 11 is obtained as shown in FIGS. 2 and 3e.

However, in the capacitor chip manufacturing method employing the above described lithographic process, the shapes of the electrodes of the both faces of the sub-wafer are different from each other. Therefore, the matching between the both face electrodes becomes difficult, and therefore, the manufacturing process becomes complicated. Further, the capacitances of the both ends become different from each other, and therefore, the resonator characteristics are ultimately affected adversely.

SUMMARY OF THE INVENTION

The present invention is intended to overcome the above described disadvantages of the conventional technique.

Therefore it is an object of the present invention to provide a ceramic resonator in which a capacitor of the resonator is manufactured by a simple process, and uniform capacitances can be obtained from the both end portions of the capacitor, thereby improving the characteristics of the resonator.

It is another object of the present invention to provide a method for manufacturing a ceramic resonator in which a capacitor of the resonator is manufactured by a simple process, and uniform capacitances can be obtained from the both end portions of the capacitor, thereby improving the reliability of the resonator.

In achieving the above objects, the high frequency resonator according to the present invention includes: a ceramic piezoelectric device; a capacitor; a lead frame for securing the ceramic piezoelectric device and the capacitor; and an epoxy resin molding film for molding the piezoelectric device, the capacitor and the lead frame into a unitized form. The high frequency resonator further includes: an electrode part formed by printing a metal paste on one face of a sub-wafer of a capacitor chip in a dual-striped form; and another electrode part formed by printing a metal paste on another face of the sub-wafer so as to be partly overlapped with the electrode part of the one face of the sub-wafer.

In another aspect of the present invention, the method for manufacturing a ceramic resonator according to the present invention includes the steps of: forming a ceramic piezoelectric device, a capacitor chip and a lead frame; assembling the piezoelectric device and the capacitor chip into the lead frame; and molding the assembled chip by using epoxy resin. The process for making the capacitor includes the steps of: cutting a ceramic wafer into a plurality of sub-wafers; printing electrodes on one face of the sub-wafer in a dual-striped form, drying the sub-wafer thus printed; printing another electrode on a central part of another face of the sub-wafer so as to be overlapped with the electrodes of the one face of the sub-wafer; drying the sub-wafer thus printed; baking the sub-wafer thus dried; and cutting the sub-wafer thus baked into a plurality of capacitors.

In still another aspect of the present invention, the high frequency resonator according to the present invention includes: a ceramic piezoelectric device; a capacitor; a lead frame for securing the ceramic piezoelectric device and the capacitor; and an epoxy resin molding film for molding the piezoelectric device, the capacitor and the lead frame into a unitized form. The high frequency resonator further includes: a plurality of electrodes formed by printing a metal paste on one face of a sub-wafer of a capacitor chip, the plurality of the electrodes being interconnected by a plurality of connection electrodes; and a second plurality of electrodes formed by printing a metal paste on another face of the sub-wafer, the plurality of the electrodes being interconnected by a plurality of connection electrodes with a same connection structure.

In still another aspect of the present invention, the method for manufacturing a ceramic resonator according to the present invention includes the steps of: forming a ceramic piezoelectric device, a capacitor chip and a lead frame; assembling the piezoelectric device and the capacitor chip into the lead frame; and molding the assembled chip by using epoxy resin. The process for making the capacitor includes the steps of: cutting a ceramic wafer into a plurality of sub-wafers; printing a plurality of electrodes on one face of the sub-wafer in addition to connection electrodes; drying the sub-wafer thus printed; printing a second plurality of electrodes on another face of the sub-wafer in addition to connection electrodes; drying the second plurality of the electrodes; baking the sub-wafer thus dried; and cutting the sub-wafer thus baked into a plurality of capacitors.

BRIEF DESCRIPTION OF THE DRAWINGS

The above objects and other advantages of the present invention will become more apparent by describing in detail the preferred embodiment of the present invention with reference to the attached drawings in which.

DETAILED DESCRIPTION OF THE PREFERRED EMBODIMENTS

The resonator according to the present invention includes a piezoelectric device, a capacitor chip and a lead frame. The kinds of the piezoelectric device may be various, and the typical one is as follows. That is, a wafer is cut into a plurality of sub-wafers, the sub-wafer is polarized, and electrodes are formed on the both ends of the polarized sub-wafer.

However, unlike the conventional lithographic process, the present invention forms differently shaped electrodes on the faces of the sub-wafer.

Figure 1:
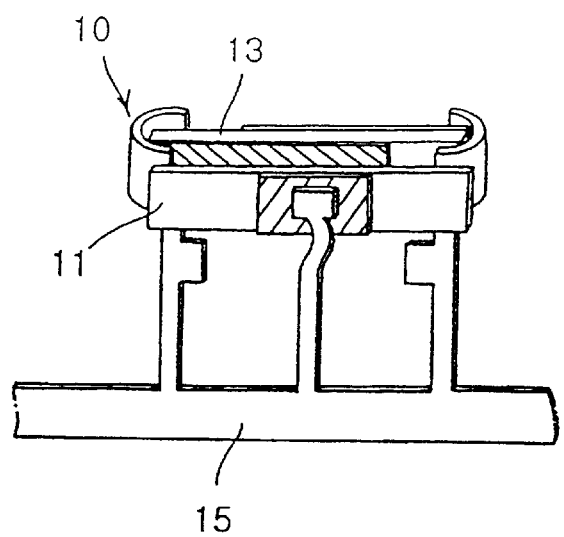
FIG. 1 illustrates the general ceramic resonator.
Figure 2:
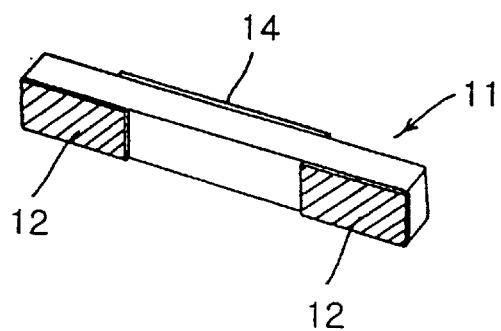
FIG. 2 is a detailed illustration of the capacitor of FIG. 1.
Figure 3A:
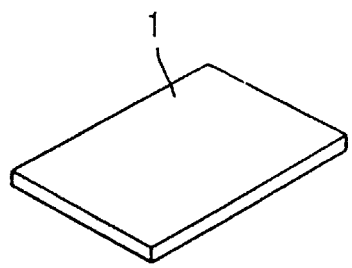
FIGS. 3(a)–3(e) illustrates the manufacturing process for the capacitor chip of the conventional resonator.
Figure 3B:
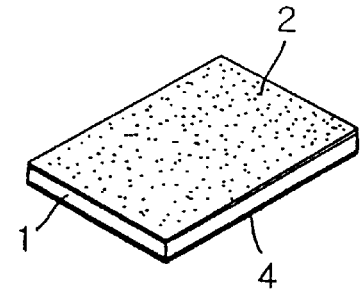
Figure 3C:
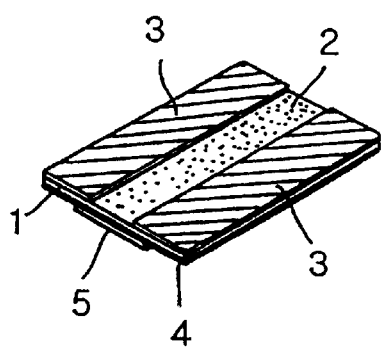
Figure 3D:
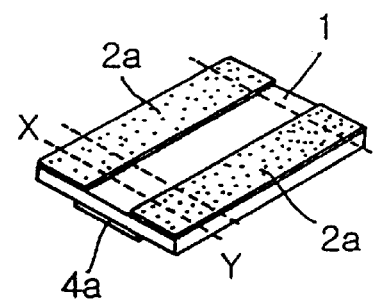
Figure 3E:
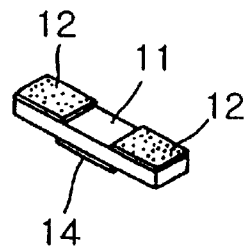
Figure 4:
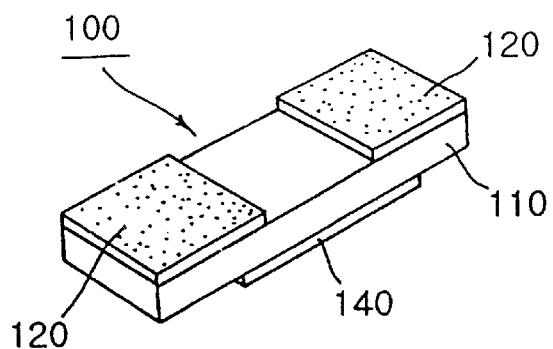
FIG. 4 illustrates the capacitor chip for the high frequency resonator according to the present invention.

FIG. 4 illustrates the capacitor chip of the resonator according to the present invention. On one face of a sub-wafer 110, there are formed electrodes 120 by printing a metal paste. On the other face of the sub-wafer 110, there is formed another electrode 140 in such a manner that it should be partly overlapped with the electrodes 120 of the one face of the sub-wafer 110.

The manufacturing process for the capacitor chip of the high frequency resonator according to the present invention is illustrated in FIGS. 5(a)–5(d). The manufacturing process for the capacitor chip 100 according to the present invention is carried out in the following manner.

Figure 5A:
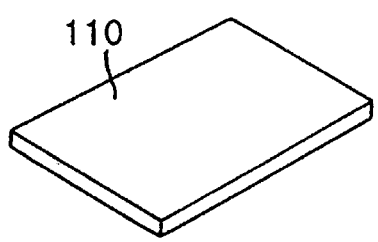
FIGS. 5(a)–5(d) illustrate the manufacturing process for the capacitor chip of the resonator according to the present invention.

As shown in FIG. 5a, first, piezoelectric powders are pressed to form a wafer on a sheet. This press-formed wafer is baked, and the baked wafer is cut into a plurality of sub-wafers 110.

If the wafer formation is to be efficiently carried out, the manufacture of a synthetic piezoelectric powder is important. This is due to the fact that the formation characteristics give very much influence to the density of the sintered body.

Accordingly, the size of the raw powders for the wafer should be preferably 0.6–0.8 μm in view of the reactivity during the baking. The particles of the powders should be uniform and spherical. If the particles are too small, or if the size is not uniform, or if the density of the powders is too low, then the flow property is aggravated, with the result that the formation pressure is increased during the formation, and consequently the baking density is lowered.

That is, when crushing the powders, if the particle size becomes as small as 0.1–0.3 μm, then an abnormal growth occurs during the baking, and a dense structure cannot be obtained.

Figure 5B:
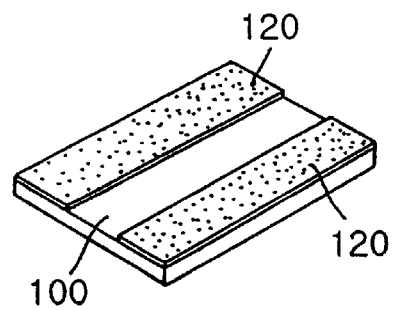

Then as shown in FIG. 5b, the sub-wafer 110 thus manufactured is subjected to a printing of an electrode part 120 on one face of it by spreading a paste (containing a metal) and by using a pressed net. When the electrode part is printed, it is important that the adherence of the electrode part and the thickness of the electrode part be properly controlled. If the adherence of the electrode layer is weak, then the characteristics of the high frequency resonator are adversely affected. Particularly, during the soldering attachment, the electrode layer may be detached, with the result that the oscillation characteristics are degraded.

Further, if the thickness of the electrode layer is too thick, the metal may be corroded at the soldered part. Therefore, in the present invention, the thickness of the electrode layer should be preferably such that its thickness should be about 10–20 μm after the baking.

In order to achieve this, a precisely pressed net other than the general net should be used. Such a pressed net can improve the resolution, and makes it possible to control the thickness of the oil film, the squeezing pressure, the metal content, the viscosity and the baking temperature, thereby obtaining a proper high frequency filter characteristic.

For example, when manufacturing the printing screen, the thickness of the oil film should be about 15 μm.

As to the metal paste, the particle size should be preferably 6–15 μm, and an Ag paste containing Ag preferably in an amount of 70–78% should be preferably used. In the case of the Ag paste, if the Ag content is too high, the cost is increased, thereby aggravating the economy. If it is too low, the electrical resistivity becomes too high so as to give an undesirable influence to the capacitor chip.

Figure 5C:
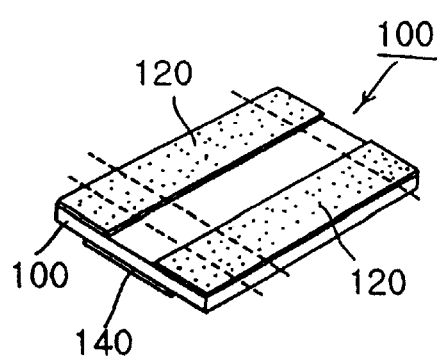

As shown in FIG. 5b, the metal paste is spread on one face of the sub-wafer to form the electrode part 120. Then it is left at the normal temperature for a certain period of time for the levelling, and then, a pre-drying is carried out. Then as shown in FIG. 5c, the metal paste is spread on the other face of the sub-wafer to from the electrode part 140, and then a pre-drying is carried out. Then the drying proper is carried out.

Figure 6:
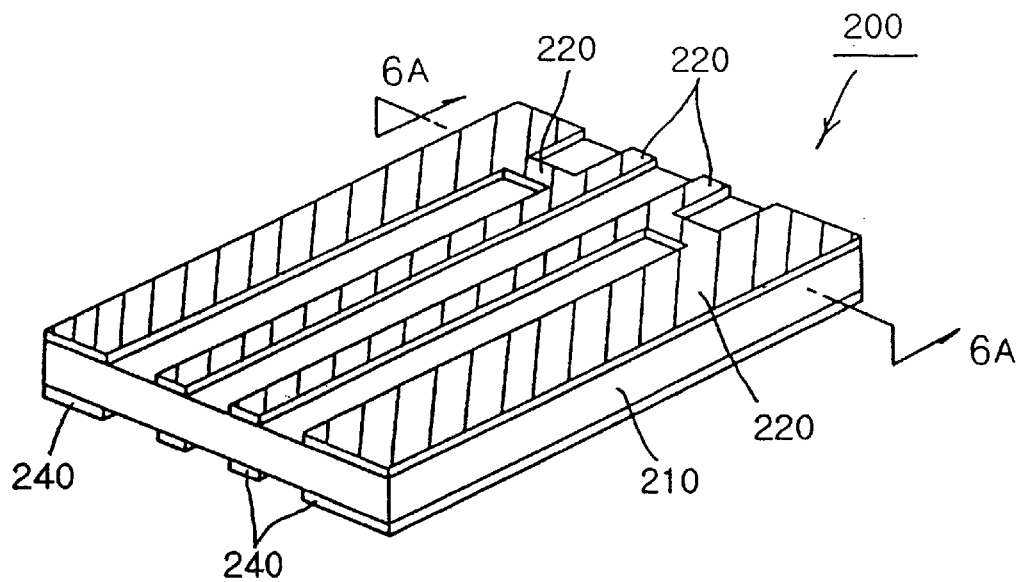
FIG. 6 illustrates the manufacturing process for another embodiment of the capacitor chip according to the present invention.
Figure 6A:
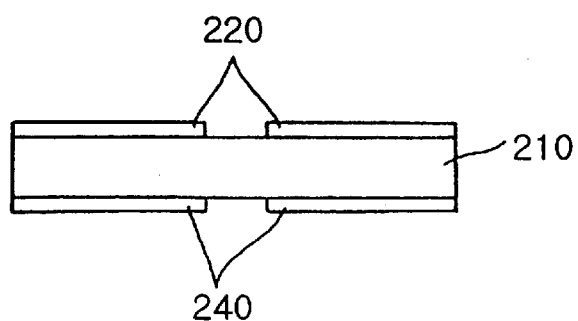

Meanwhile, in the second embodiment of FIG. 6, there are shown the printed electrode parts 220 and 240.

That is, on one face of a sub-wafer 210 of a capacitor chip 200, there is spread a metal paste to form a plurality of electrode parts 220 which are interconnected by connection electrodes 220'. On the other face of the sub-wafer 210, there are formed a second plurality of electrodes parts 240 which are interconnected by connection electrodes 240', the connection electrodes 240' having the same shape as the connection electrodes 220' of the one face of the sub-wafer 210.

Figure 7A:
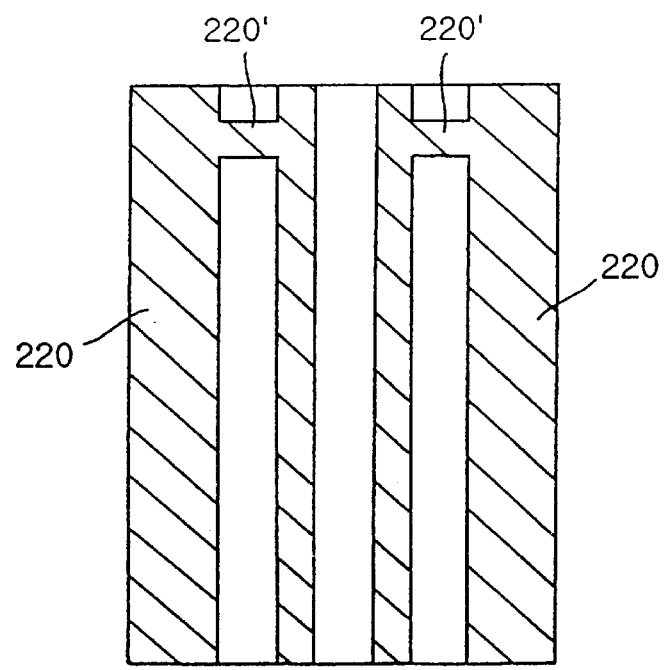
FIGS. 7(a(–(b) illustrates the front and rear face of the capacitor chip of FIG. 6.
Figure 7B:
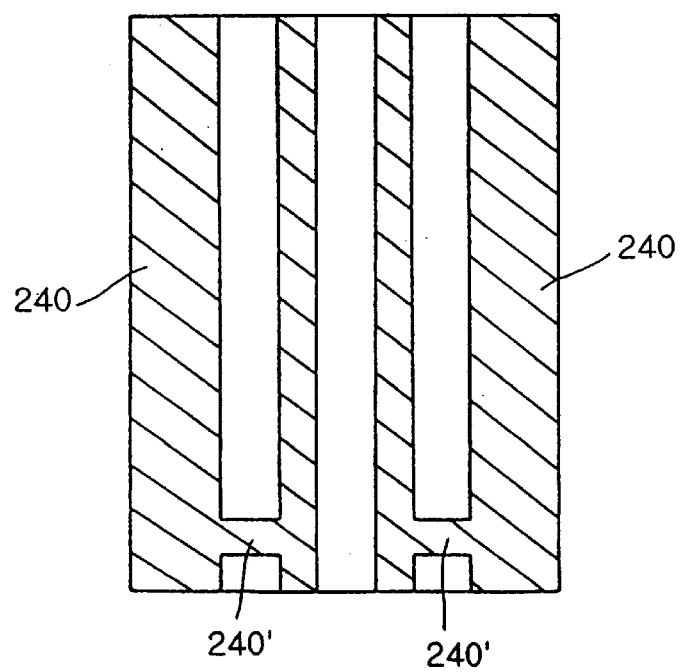

As shown in FIG. 6, when printing the electrode patterns on the sub-wafer 210, the electrode parts 220 and 240 on the both faces of the sub-wafer 210 should preferably have the same patterns. That is, as shown in FIG. 7a and 7b, by providing the same patterns of the electrode parts, the orientation of the capacitor chip is eliminated. Therefore, the capacitance values of the capacitor chips are made equal to each other, thereby improving the characteristics of the resonator.

Accordingly, the patterns of the electrodes of the present invention are not limited to those of FIGS. 5 and 6, but any other pattern may be adopted.

Figure 5D:
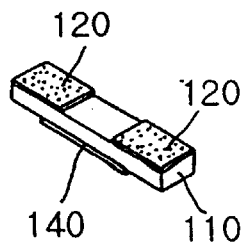

The sub-wafer 110 or 210 thus dried is baked, and then, is cut into a plurality of capacitor chips 100 or 200 as shown in FIG. 5d. The baking should be carried out preferably at a temperature of 650–680° C., while the baking time should be preferably 10–20 minutes, and more preferably 12–15 minutes.

Then each of the cut chips 100 or 200 is inserted into the lead frame. Then a solder-attaching step, a wax spreading step and a resin impregnating step are carried out, and then, the resin is cured so as to form cavities within the device. Then an epoxy resin is coated on the structure to complete the high frequency resonator of the present invention.

Now the present invention will be described based on actual examples, but the scope of the present invention will not be limited to these specific examples.

<EXAMPLES>

Spherical PZT powders having particle sizes of 0.6–0.8 $\mu$m were press-formed into a size of 31 mm×31 mm by applying a pressure of 1.5 tons/cm$^2$. This formed structure was baked for about 2 hours at 1080° C., thereby obtaining a wafer having a size of 26.5 mm×26.5 mm×0.3 mmt. The density of this wafer was 7.988 g/cc which approaches the theoretical value, while the microstructure was about 2–3 $\mu$m.

The baked wafer was ground to a thickness of 0.4–0.5 $\mu$m, and then, the ground wafer was cleaned and dried. Then the wafer was cut into a plurality of ceramic sub-wafers having a size of 26.5 mm×6.8 mm×0.3 mmt. Then the sub-wafer was washed by using a distilled water, and a drying was carried out for 1 hour at 170° C.

Then a paste containing about 78% of Ag particles (having a size of about 15 $\mu$m) was spread on one face of the dried sub-wafer to form electrodes in a thickness of 15 $\mu$m. Then the structure was left at the normal temperature for 5 minutes for levelling, and then, it was left within a drier at a temperature of 80° C. for 20 minutes. Then the other face of the sub-wafer was printed, and then a drying was carried out at 80° C. for 20 minutes. Then a drying proper was carried out at 170° C. for 30 minutes.

The dried sub-wafer was subjected to a heat treatment, and then, was cut into a plurality of chips, each having a width of 1.0 mm considering the capacitance. Then the cut chip was inserted into a lead frame, and then, a solder-attaching step and a phenol impregnating step were carried out. Then a phenol curing was carried out, and cavities were formed to do a marking. Then a resin was coated on the entire structure to prevent a moisture intrusion.

TABLE 1

|  | H. T temperature | H. T. time (min) | Resistivity ($\Omega$-m) | Adherence |
|---|---|---|---|---|
| Inventive example 1 | 650° C. | 12 | 1.2 | Good |
| Inventive example 2 | 665° C. | 12 | 1.0 | Good |
| Comparative exmpl 1 | 670° C. | 5 | 1.8 | No good |
| Inventive example 3 | 670° C. | 10 | 1.5 | Ordinary |
| Inventive example 4 | 670° C. | 12 | 1.0 | Good |
| Inventive example 5 | 670° C. | 15 | 1.2 | Good |
| Inventive example 6 | 670° C. | 20 | 2.0 | Ordinary |
| Comparative exmpl 2 | 670° C. | 25 | 2.8 | No good |
| Inventive example 7 | 680° C. | 12 | 0.9 | Good |

Note:
H. T. represents "heat treatment".

In the actual examples of the present invention, it could be seen that various patterns of electrodes could be printed even without going through the conventional lithographic process. Actually, when the conventional lithographic process was gone through, it took about 7 hours from the electrode formations on the both faces of the sub-wafer to the drying, whereas the screen printing method of the present invention took only 1 hour or less.

As can be seen in Table 1 above, the inventive examples (1–7) which met the conditions of the present invention showed a good adherence and a good resistivity, while the case where the baking conditions were departed showed to be somewhat insufficient.

According to the present invention as described above, the manufacturing process for the capacitor chip is very much simplified compared with the conventional lithographic process. Further, uniform capacitances are obtained from the both end portions of the capacitor, thereby improving the reliability of the resonator.

In the above, the present invention was described based on the specific embodiments and drawings, but it should be apparent to those ordinarily skilled in the art that various changes and modifications can be added without departing from the spirit and scope of the present invention.

What is claimed is:

1. A method for manufacturing a ceramic resonator, comprising the steps of: forming a ceramic piezoelectric device, a capacitor chip and a lead frame;
   assembling said piezoelectric device and said capacitor chip into said lead frame; and
   molding a structure thus assembled by using epoxy resin, the process for making said capacitor, comprising the steps of:
      preparing a sub-water having a predetermined thickness;
      printing electrodes on one face of said sub-wafer in a dual-striped form;
      drying said printed electrodes on one face of said sub-wafer;
      printing another electrode on a central part of another face of said sub-wafer so as to be overlapped with said electrodes of the one face of said sub-wafer;
      drying said printed electrode on a central part of another face of said sub-wafer;
      baking said sub-wafer thus dried; and
      cutting said sub-wafer thus baked into a plurality of capacitors.

2. The method as claimed in claim 1, wherein said electrodes of said sub-wafer are printed by using a pressed net.

3. The method as claimed in claim 1, wherein said sub-wafer is baked at a temperature of 650–680° C.

4. The method as claimed in claim 3, wherein said sub-wafer is baked for 10–20 minutes.

5. The method as claimed in claim 4, wherein said sub-wafer is baked for 12–15 minutes.

6. The method as claimed in claim 1, wherein said electrodes are formed by using an Ag paste.

7. The method as claimed in claim 6, wherein said Ag paste contains 70–78% of Ag.

8. The method as claimed in claim 6, wherein said Ag paste contains Ag particles having a size of 6–15 $\mu$m.

9. The method as claimed in claim 1, wherein said electrodes have a thickness of 10–20 $\mu$m after a baking.

10. A method for manufacturing a ceramic resonator, comprising the steps of: forming a ceramic piezoelectric device, a capacitor chip and a lead frame;
   assembling said piezoelectric device and said capacitor chip into said lead frame; and molding a structure thus forming a cavity and assembled by using epoxy resin, the process of making said capacitor comprising the steps of:
- preparing a sub-wafer having a predetermined thickness;
- printing a first plurality of electrodes on one face of said sub-wafer in addition to connection electrodes;
- drying said first plurality of electrodes on one face of said sub-wafer;
- printing a second plurality of electrodes on another face of said sub-wafer in addition to connection electrodes;
- drying said second plurality of electrodes on another face of said sub-wafer;
- baking said sub-wafer thus dried; and
- cutting said sub-wafer thus baked into a plurality of capacitor chips.

11. The method as claimed in claim 10, wherein said first and second electrodes of said sub-wafer are formed in a same pattern.

12. The method as claimed in claim 10, wherein said first and second electrodes of said sub-wafer are printed by using a pressed net.

13. The method as claimed in claim 10 wherein said sub-wafer is baked at a temperature of 650–680° C.

14. The method as claimed in claim 13, wherein said sub-wafer is baked for 10–20 minutes.

15. The method as claimed in claim 14, wherein said sub-wafer is baked for 12–15 minutes.

16. The method as claimed in claim 10, wherein said first and second electrodes are formed by using an Ag paste.

17. The method as claimed in claim 16, wherein said Ag paste contains 70–78% of Ag.

18. The method as claimed in claim 16, wherein said Ag paste contains Ag particles having a size of 6–15 $\mu$m.

19. The method as claimed in claim 10, wherein said first and second electrodes have a thickness of 10–20 $\mu$m after baking.

* * * * *